United States Patent
Oprescu

(10) Patent No.: US 6,208,279 B1
(45) Date of Patent: Mar. 27, 2001

(54) SINGLE-CYCLE OVERSAMPLING ANALOG-TO-DIGITAL CONVERTER

(75) Inventor: Florin A. Oprescu, Sunnyvale, CA (US)

(73) Assignee: Linear Technology Dorporation, CA (US)

( * ) Notice: Subject to any disclaimer, the term of this patent is extended or adjusted under 35 U.S.C. 154(b) by 0 days.

(21) Appl. No.: 09/135,159

(22) Filed: Aug. 17, 1998

(51) Int. Cl.[7] ........................................... H03M 3/00
(52) U.S. Cl. ............................. 341/143; 341/155
(58) Field of Search ..................... 341/143, 155, 341/144

(56) References Cited

U.S. PATENT DOCUMENTS

| | | | | |
|---|---|---|---|---|
| 4,968,987 | * | 11/1990 | Naka et al. | 341/143 |
| 5,189,419 | * | 2/1993 | Lyden | 341/143 |
| 5,349,352 | * | 9/1994 | Saleh | 341/143 |
| 5,450,028 | * | 9/1995 | Therssen | 327/91 |
| 5,923,273 | * | 7/1999 | Pastorello | 341/77 |
| 5,952,947 | * | 9/1999 | Nussbaum et al. | 341/143 |

OTHER PUBLICATIONS

Max W. Huaser "Principles of Oversampling A/D Conversion", *J. Audio Eng. Soc.,* vol. 39, No. 1/2 1991 Jan./Feb., pp. 3–26.

J.C. Candy and G.C. Temes, Oversampling Methods for A/D and D/A Conversion, Oversampling Delta–Sigma Converters, IEEE Press 1992, pp. 1–25.

J.C. Candy and G.C. Temes, A Novel Architecture Design for VLSI Implementation of an FIR Decimation Filter, Oversampling Delta–Sigma Converters, IEEE Press 1992, pp. 467–470.

J.C. Candy adn G.C. Temes, Using Triangularly Weighted Interpolation to Get 13–Bit PCM from a Delta–Sigma Modulator, Oversampling Delta–Sigma Converters, IEEE Press 1992, pp. 377–384.

Norsworthy et al., Chapter 13: Decimation and Interpolation for $\Delta\Sigma$ Conversion, Delta–Sigma Data Converters, IEEE Press 1997, pp. 406–444.

* cited by examiner

*Primary Examiner*—Peguy Jean Pierre
(74) *Attorney, Agent, or Firm*—Fish & Neave; Robert W. Morris; Michael E. Shanahan

(57) ABSTRACT

An oversampling delta-sigma analog-to-digital converter suitable for single-cycle operation is provide. In a preferred embodiment of the present invention, only one multiply-accumulate processor is present in the digital filtering stage for decimating the output sequence R(I). A system controller produces precisely timed modulator enable (EnM) and digital filter enable (EnF) signals for coordinating activation of certain circuit elements and for managing power consumption of the system.

44 Claims, 9 Drawing Sheets

SINGLE-CYCLE OVERSAMPLING ANALOG-TO-DIGITAL CONVERTER

BACKGROUND OF THE INVENTION

This invention is concerned with analog-to-digital converters. More particularly, it is concerned with oversampling delta-sigma analog-to-digital converters which are suitable for performing single-cycle conversions.

Although real world signals are analog, it is often desirable to convert them into the digital domain using analog-to-digital (A/D) converters. Circuit designers are motivated to perform this conversion because of the efficient methods currently available for the transmission, storage and manipulation of digital signals. A digital representation of an audio signal, for example, allows a CD player to achieve virtually error free storage using optical discs. The need for complicated signal processing may also necessitate A/D conversion because such signal processing is only feasible in the digital domain using either digital computers or special purpose digital signal processors. Signal processing in the digital domain is also particularly useful in such areas as biomedical applications to provide the required accuracy for such tasks as magnetic resonance imaging (MRI).

Oversampling methods have recently become popular in A/D converters because they avoid many of the difficulties encountered with traditional methods for analog-to-digital conversion. This is because such converters have certain attributes that are difficult to implement on integrated circuit devices. Foremost among these is the use of analog filters and the need for high-precision analog circuitry that is vulnerable to noise and interference. The virtue of traditional conversion techniques is the ability to use a relatively low sampling frequency, usually the Nyquist rate of the input signal (i.e., twice the signal bandwidth).

Traditional A/D converter systems require low-pass anti-aliasing filters at their input to attenuate the magnitude of high-frequency noise and out-of-band components of the signal that alias in-band when sampled at the Nyquist rate. The frequency characteristics of such filters are determined by the precision of the analog components with which they are made.

On the other hand, oversampling A/D converters can use simple and relatively high-tolerance analog components, but require fast and fairly complex digital signal processing stages. They modulate the analog input into a simple digital code, usually single-bit words, at a frequency much higher than the Nyquist rate. These modulators operate by trading off resolution in amplitude for resolution in time such that imprecise analog circuits may be used. The use of high-frequency modulation can eliminate the need for abrupt cutoffs in the analog anti-aliasing filters at the input to the A/D converter. A digital low-pass filter can smooth the output of the digital modulator, attenuating noise, interference, and high-frequency components of the signal before they can alias into the signal band when the signal is re-sampled at the Nyquist rate. Another digital filter may be used to decimate the single-bit code to a high-word-rate digital pulse code modulated signal at the output.

Oversampling A/D converters make extensive use of digital processing, taking advantage of the fact that integrated circuit technology is better suited for providing fast digital circuits than for providing precise analog circuits. Because their sampling rate usually needs to be substantially higher than the Nyquist rate, conventional oversampling A/D converters are generally used in medium-speed digital applications such as digital audio, digital telephony and data communications. Such applications require the continuous production of A/D conversion results from a single input source. As a result, a well-defined settling time is of little importance to conventional A/D converters. Furthermore, power consumption in conventional oversampling A/D converters tends to be relatively high because the converter circuitry must remain constantly activated to produce continuous conversion results.

Nevertheless, due to their exceptional resolution and accuracy, oversampling A/D converters are also desirable for such tasks as data acquisition, industrial control and test and measurement instrumentation. In many such applications, only a single conversion result from a given input source is desired. For example, an analog input signal may be selected from a number of uncorrelated distinct sources by an input multiplexer or may be sampled at uncorrelated time intervals depending upon the desired function. In such applications, the A/D converter makes only one conversion for a given input signal before a new input signal is provided for conversion. Therefore, in single conversion or "single-cycle conversion" applications, output data oversampling and strong time correlation between successive conversion results is of little importance.

Conventional oversampling A/D converters are not well suited for performing single-cycle A/D conversions because they are designed to repeatedly sample a given analog input signal for an extended period of time to produce multiple conversion results at a rate higher than twice the input signal bandwidth. Such A/D converters have complex digital filtering stages and poorly defined settling times which tends to make input multiplexing difficult. In addition, because conventional oversampling A/D converters are typically designed to operate continuously for extended periods of time, they contain no power saving circuitry for turning off portions of the converter when not in use, a condition that occurs frequently in single-cycle operation.

In view of the foregoing, it would be therefore desirable to provide an oversampling A/D converter suitable for providing single-cycle A/D conversions.

It would also be desirable to provide an oversampling A/D converter that included circuitry for selectively turning on and off portions of the converter circuitry to minimize power consumption when conversions are not required.

It would be also desirable to provide an oversampling A/D converter that included digital filter circuitry of reduced complexity.

It would be additionally desirable to provide an oversampling A/D converter that has a well defined settling time to facilitate input multiplexing.

SUMMARY OF THE INVENTION

It is therefore an object of the present invention to provide an oversampling A/D converter that is suitable for performing single-cycle A/D conversions.

It is another object of the present invention to provide an A/D converter that includes circuitry for minimizing power consumption.

It is another object of the present invention to provide an oversampling A/D converter that includes digital filter circuitry of reduced complexity.

It is further object of the present invention to provide an oversampling A/D converter that has a well defined settling time to facilitate input multiplexing.

In accordance with these and other objects of the present invention, oversampling delta-sigma A/D converters suitable for single-cycle operation are described. The A/D converters may include a delta-sigma modulator, a digital decimation filter and a system controller. Upon receipt of a conversion start signal the system controller may direct the delta-sigma modulator to sample and digitize an analog input signal to produce series of pulse density modulated output signals Y(k). Output signals Y(k) are filtered and decimated by the digital filter to produce an output word R(I) which is a digital representation the sampled input signal. In a preferred embodiment of the present invention, only one multiply-accumulate processor is present in the digital filtering stage for decimating output signals Y(k). The system controller may produce precisely timed modulator enable (EnM) and digital filter enable (EnF) signals for coordinating activation and de-activation of certain circuit elements in the A/D converter to minimize power consumption.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

BACKGROUND

Figure 1A:
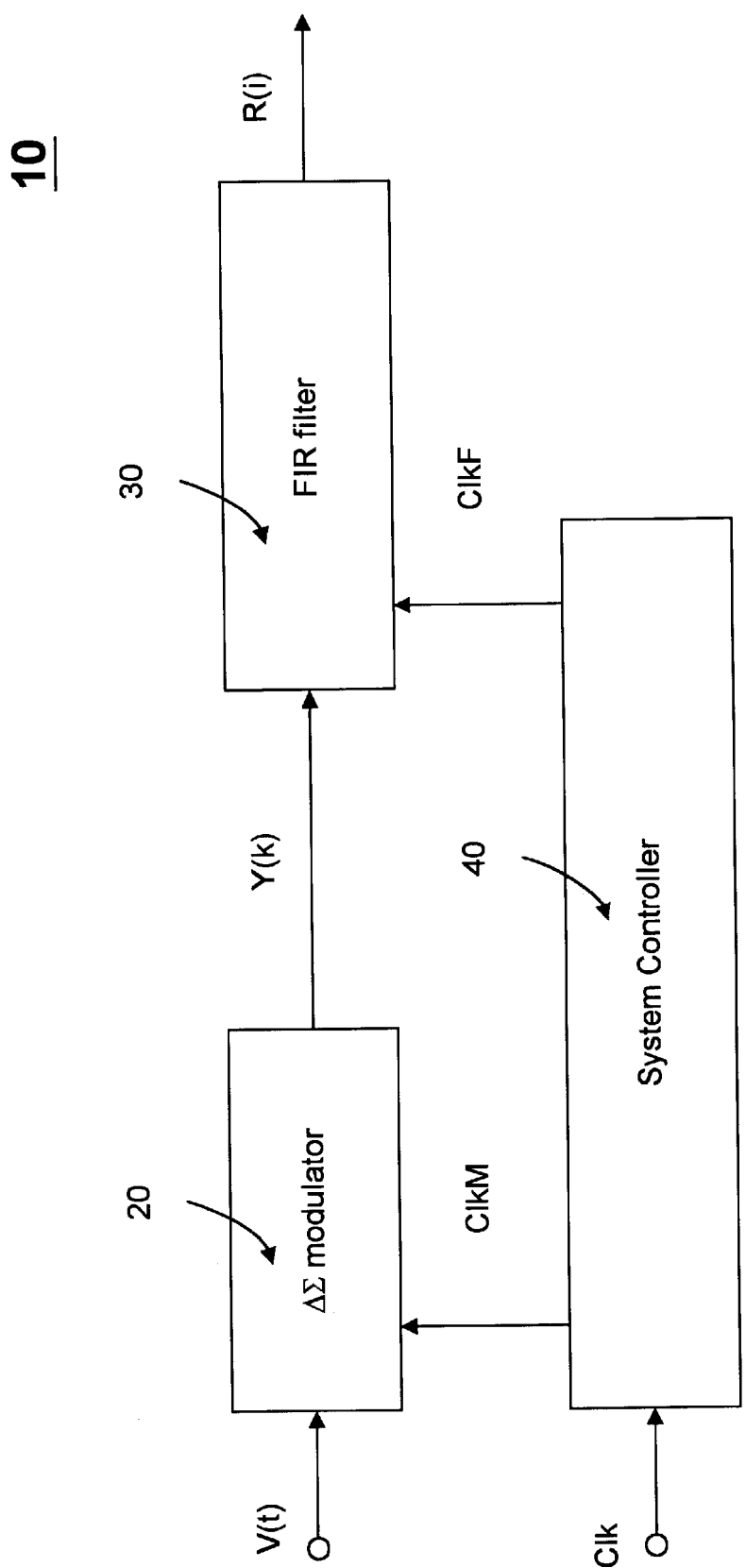
FIG. 1a is a block diagram of a prior art oversampling delta-sigma A/D converter.
Figure 1B:
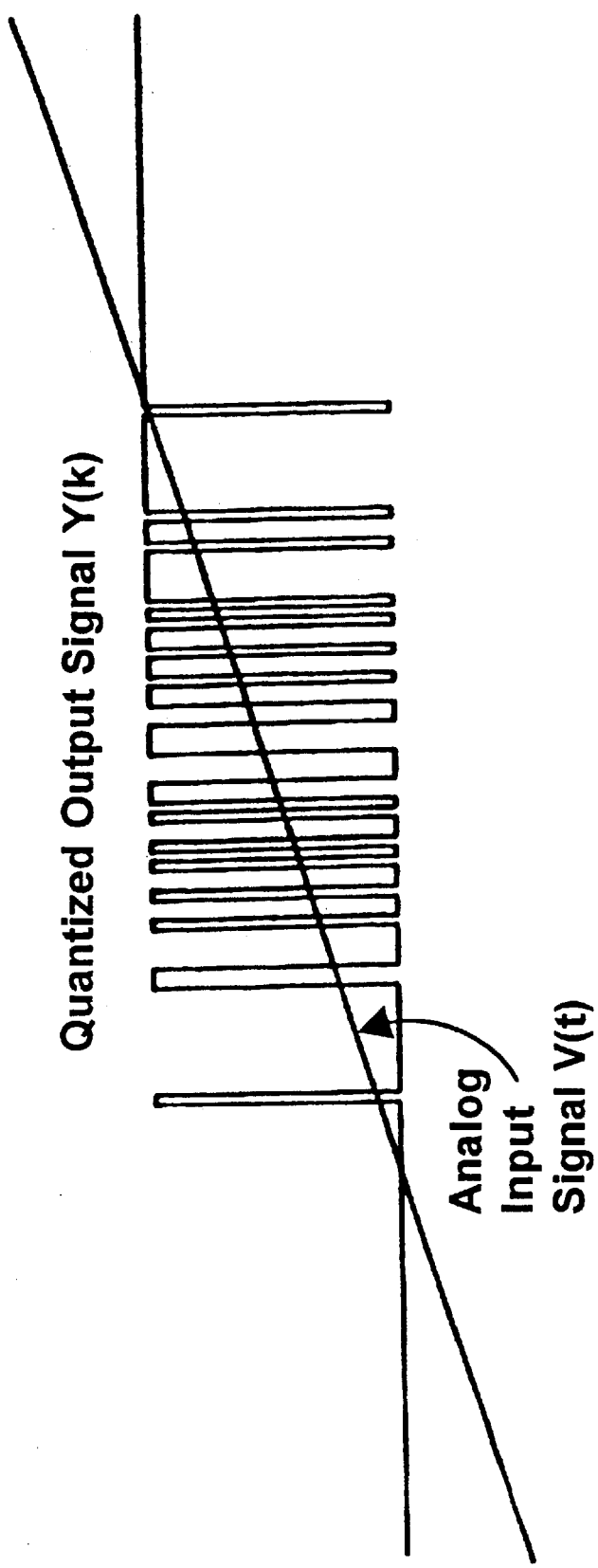
FIG. 1b is a graph illustrating the response of a one-bit delta-sigma modulator a ramp input signal.

A block diagram of a conventional oversampling delta-sigma A/D converter 10 is shown in FIG. 1a. A/D converter 10 consists of three basic blocks, delta-sigma modulator 20, finite-impulse-response (FIR) digital filter 30, and system controller 40. In FIG. 1a, delta-sigma modulator 20 continuously samples analog input signal V(t) at a very high rate (i.e., many times the Nyquist rate) as directed by clock signal ClkM produced by system controller 40. Modulator 20 generates a series of digital one-bit output samples Y(k) that oscillate between logic "high" and logic "low" depending on the magnitude of input signal V(t). This causes analog input signal V(t) to become pulse-density-modulated, that is, the average level of the digital signal Y(k) at the output of modulator 20 is approximately equal to the average magnitude of the analog input signal V(t) over the same time period. FIG. 1b illustrates the response of a first-order delta-sigma modulator 20 to a ramp input signal V(t). As the magnitude of V(t) increases the number of digital pulses in signal Y(k) that are logic high also increase so that the average value of those pulses match the current value of V(t). Conversely, as the magnitude of V(t) decreases, the number of digital pulses in signal Y(k) that are logic high also decreases to reflect the value of V(t).

Figure 1C:
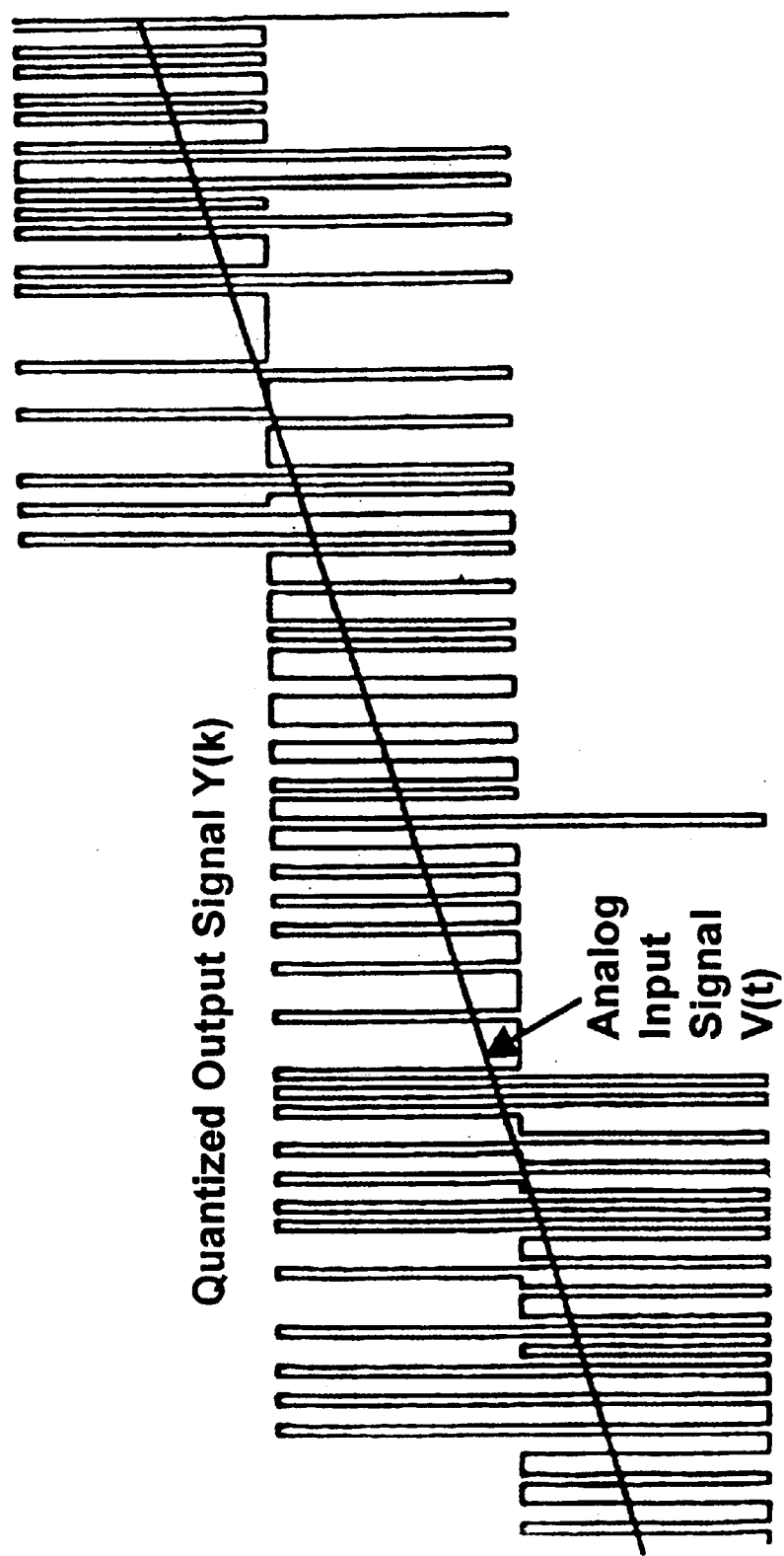
FIG. 1c is a graph illustrating the response of a two-bit delta-sigma modulator a ramp input signal.

Although one-bit quantization is common, multi-bit quantization may be suitable for certain applications. In such applications, the resolution of digital signal Y(k) varies according to the number of quantization levels available in a given delta-sigma modulator 20. FIG. 1c illustrates the response of a second-order (two-bit) delta-sigma modulator to a ramp input signal V(t). The output of second-order delta-sigma modulator 20 oscillates predominately between three of the four available levels such that the local average of digital signal Y(k) equals the average magnitude of analog input V(t). Even though multi-bit modulators are more complex than single-bit modulators, they are desirable in certain applications because they avoid quantizier saturation problems that occur in single-bit modulators when the average magnitude of input signal V(t) is greater than the maximum density of Y(k). If desired, such problems can also be avoided by scaling the input signal V(t) to match the maximum resolution of modulator 20.

As shown in FIG. 1a, digital filter 30 further processes modulated digital signals Y(k) as directed by clock signal ClkF produced by system controller 40. Digital signals Y(k) are produced by modulator 20 at a frequency Fs and represents the pulse-modulated input signal V(t) together with any quantization noise, out-of-band components, circuit noise, and interference that may be included in the analog signal. As pulses in signal Y(k) propagate through digital filter 30, quantization noise is attenuated and digital signal Y(k) is decimated into digital output words R(I) at a frequency of Fo. The modulator output frequency Fs is usually an integer multiple of the digital filter output frequency Fo such that Fs>Fo. The digital filter decimation ratio D is defined as D=Fs/Fo. This represents the ratio at which digital signal Y(k) (which is a sequence of one-bit digital words occurring at a high sampling frequency Fs) is transformed into a series long digital output words R(I). Thus, digital filter 30 may be viewed as a pulse-density-modulation (short digital word) to pulse-code-modulation (long digital word) converter.

It is common for output word R(I) to retain a certain degree of oversampling after passing through digital filter 30. If desired, further digital processing such as low-pass filtering and down-sampling digital word R(I) to the Nyquist rate may be performed to produce the final output signal (not shown).

Figure 2:
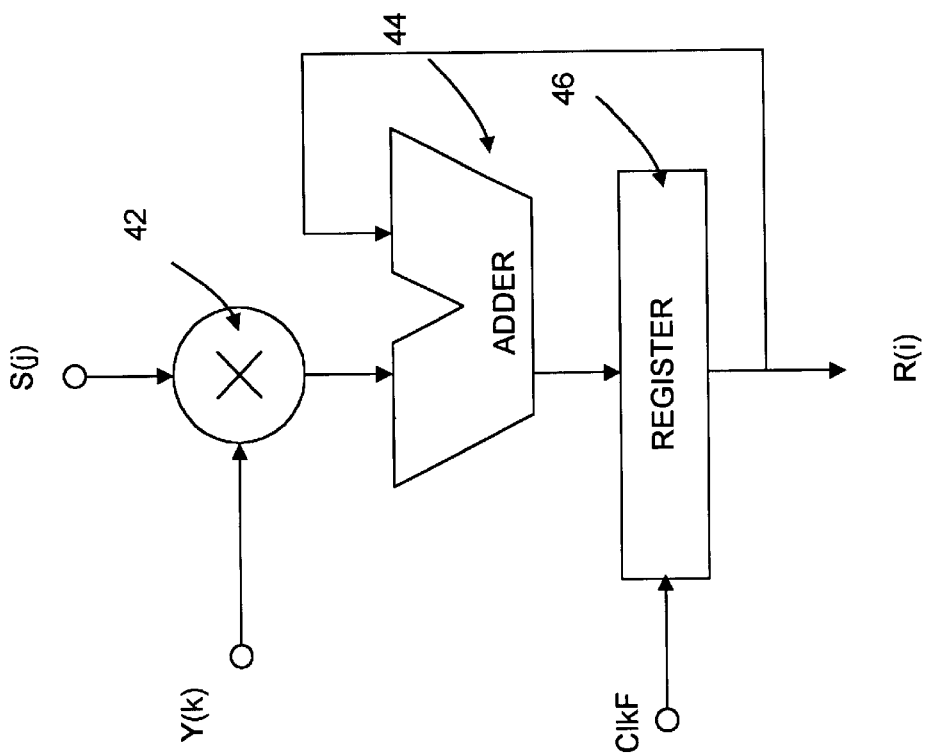
FIG. 2 is a schematic diagram of a prior art multiply-accumulate processor.

A schematic diagram of a multiply-accumulate processor 41 that is included in digital filter 30 is shown in FIG. 2. Multiply-accumulate processor 41 includes three basic blocks, multiplier 42, adder 44, and register 46. As shown in FIG. 2, filter coefficient sequence S(j) of length n (j=1,2 ... n) is convolved with pulses of digital signal Y(k). The convolution operation is performed by multiplying successive samples of digital signal Y(k) with successive coefficients of the coefficient sequence S(j) in multiplier 42. Typically, each coefficient in sequence S(j) is multiplied with one element of digital sequence Y(k) every clock cycle. The results of each multiplication are accumulated in register 46 by adder 44. A complete convolution result is available in register 46 after all the coefficients in coefficient sequence S(j) are multiplied with input samples Y(k). Accordingly, a multiply-accumulate processor 41 having a coefficient sequence S(j) of length n will typically require n clock cycles to produce one complete convolution result.

If the length n of coefficient sequence S(j) is chosen so that the amount of time required to multiply all the coefficients in that sequence is less than or equal to the output rate B (B=1/Fo) of digital filter 30, a complete convolution result will always be available in register 46 at a rate greater than or equal to B. Such a configuration would allow A/D converter 10 to produce an output word R(I) for an input signal V(t) at a data rate faster than required output rate B. Nevertheless, this is not usually done in practice because selecting a coefficient sequence of length n such that n clock cycles is less than or equal to the output rate B tends to limit the overall performance of A/D converter 10 (i.e., increases speed but decreases resolution). Thus, in most applications the amount of time required to calculate a complete convolution result is longer than the desired output rate B. This means that a single multiply-accumulate processor 41 cannot produce output words R(I) fast enough to satisfy the required output rate B.

Figure 3:
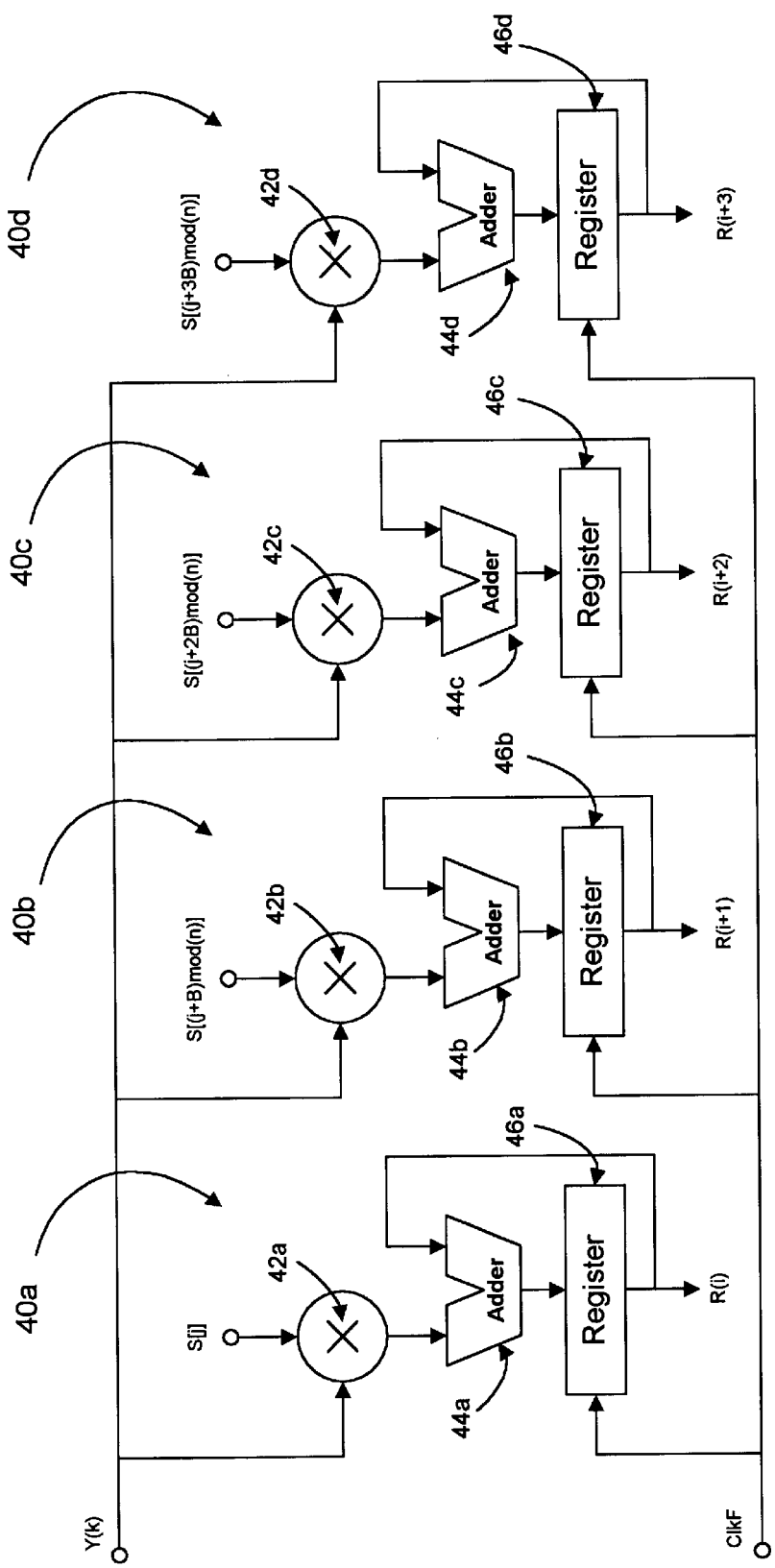
FIG. 3 is a schematic diagram of four prior art multiply-accumulate processors operating in parallel.

Conventional delta-sigma A/D converters avoid this problem by operating multiple multiply-accumulate processors 41 in parallel. For example, assuming a particular digital filter has a coefficient sequence of length n which takes four times longer than the required output rate B to process a complete convolution result. A digital filter having a $Sinc^4$ (Kω) frequency response (where K is constant) can be constructed that will provide an output word R(I) at an output rate B after an initial transient delay period. This is shown in FIG. 3. Because the length of the coefficient sequence n is equal to four times B, and because the calculation of a complete convolution result requires n cycles, a minimum of four multiply-accumulate processors 41 are required to operate in parallel to produce one output word R(I) every B clock cycles.

As shown in FIG. 3, the four coefficient sequences S[j], S[(j+B)mod(n)], S[(j+2B)mod(n)], S[(j+3B)mod(n)] are identical copies of the same filter coefficient sequence S[j] j=1,2 . . . n, each delayed from the previous one by exactly B clock cycles in a circular fashion. These coefficient sequences are multiplied during every clock cycle with one element of the modulator output signal Y(k) in the four multipliers 42 and the results are accumulated in registers 46 by adders 44. For example, in FIG. 3, assume the desired output rate B is equal to ten clock cycles and the coefficient sequence length n is equal to 40. It will take 40 clock cycles to produce the first output word R(I). Thereafter, output words R(I) will be produced every 10 clock cycles.

The multiply-accumulate processor scheme shown in FIG. 3 operates as follows. As the first ten digital signal elements Y(1)–Y(10) are produced by the modulator and applied to the input of the filter, multiply-accumulate processor 41a multiplies each corresponding S(j) coefficient with a corresponding element of the digital signal Y(k), (i.e., S(1) with Y(1) etc.) and stores each result in register 46a. When the following ten digital signal elements Y(11)–Y(20) are produced and applied to the filter input, multiply-accumulate processor 41a multiplies the next ten S(j) coefficients (i.e., S(11)–S(20)) with the corresponding elements and again stores each result in register 46a. Simultaneously, multiply-accumulate processor 46b multiplies the digital signal element Y(11)–Y(20) with the first ten S(j) coefficients S(1)–S(10) and stores each result in register 46b. When digital signal elements Y(21)–Y(30) are produced and applied to the filter input, multiply-accumulate processor 41a multiplies the next ten S(j) coefficients S(21)–S(30) with those elements and stores each result in register 46a. Simultaneously, multiply-accumulate processor 46b multiplies the digital signal elements Y(21)–Y(30) with the next ten S(j) coefficients (i.e., S(11)–S(20)) and stores each result in register 46b. Also, multiply-accumulate processor 46c multiplies the digital signal elements Y(21)–Y(30) with S(j) coefficients S(1)–S(10) and stores each result in register 46c. When digital signal elements Y(31)–Y(40) are produced and arrive at the filter input, multiply-accumulate processor 41a multiplies the next ten S(j) coefficients, S(31)–S(40) with those elements and stores each result in register 46a.

At this point, a complete convolution result is present in register 46a. because all 40 coefficient sequence elements in S(j) (i.e., S(1)–S(40)) have been multiplied with 40 elements of digital input signal Y(k) (i.e., Y(1)–Y(40)). Therefore, a digital word R(I) representing the analog input signal V(t) is present in register 46a. In addition, multiply-accumulate processors 41b, 41c and 41d multiply digital input signal elements Y(31)–Y(40) with their corresponding filter coefficients and store each result in their respective registers 46b–46d.

As can be seen from the above description, every B clock cycles one of the four registers 46 completes a convolution calculation when it accumulates the result of the multiplication between an input signal element Y(k) and the last filter coefficient S(n) generating the output word R(I). In the next cycle, that multiply-accumulate processor (41a) is reused to start computing the R(I+4) output word. The corresponding register (46a) is initialized to zero and another sequence of n multiply-accumulate operations is started which will result in the output sequence sample R(I+4). The coefficient sequence index restarts from j=1 in a circular fashion.

Figure 4:
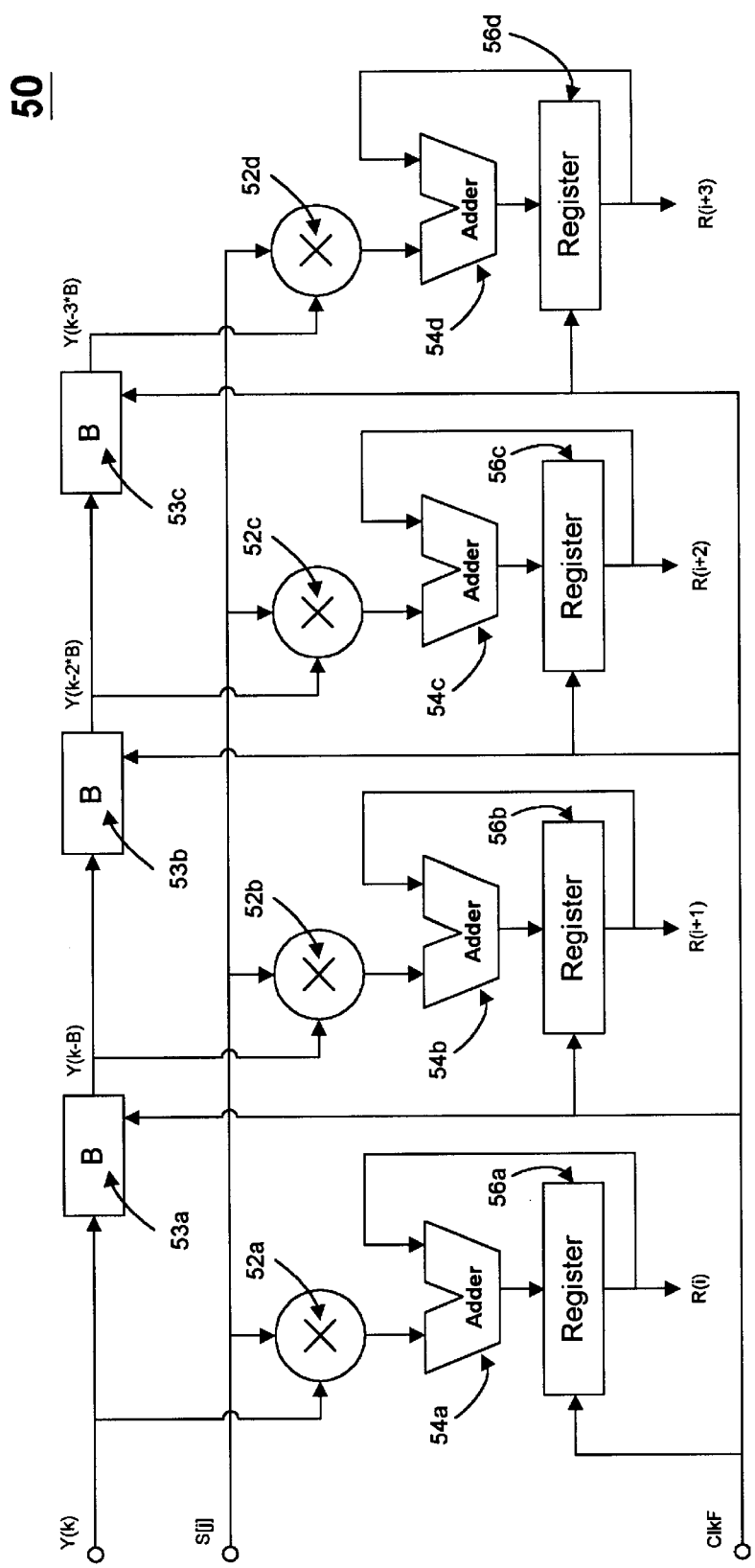
FIG. 4 is a schematic diagram of another implementation of four prior art multiply-accumulate processors operating in parallel.

A well-known alternative implementation of the $Sinc^4$ (Kω) filter depicted in FIG. 3 is shown in FIG. 4. In FIG. 4, four input digital input sequences Y(k), Y(k–B), Y(k–2*B) and Y(k–3*B) which are copies of the input signal Y(k) are each delayed by B cycles with respect to the previous one. The delay is produced by delay blocks 53. These four sequences are multiplied in separate multiply-accumulator processors 50 with the coefficient sequence S[j] thus generating the output word R(I). Each multiply-accumulate processor comprises a multiplier 52 an adder 54 and an accumulator register 56.

Upon inspection of the filter configurations shown in FIGS. 3 and 4, it is apparent that a conventional oversampling A/D converter using such filters will experience a transient delay period when a new input signal V(t) is applied at the converter input. For example, in FIG. 1, depending on the architecture of modulator 20, after a delay of m cycles (the modulator transient delay) digital signal Y(k) starts to reflect the newly applied input signal V(t). As a function of the status of digital filter 30 at this exact moment in time, a correct analog-to-digital conversion result R(I) may be obtained after a variable delay ranging from a minimum of n cycles to a maximum of n+B−1 cycles. In various practical implementations an additional delay of p cycles may occur due to internal pipeline stages. Thus, the total transient response time of A/D converter 10 may vary from a minimum of m+n+p cycles to a maximum of m+n+B+p−1 cycles.

It is also clear from FIGS. 3 and 4 that only one of the multiply-accumulate processors 41 or 50 is used at any given time to produce the desired output word R(i). The output of the other multiply-accumulate processors is discarded as inaccurate due to the transient delay or is redundant if output oversampling characteristics are not used in subsequent digital processing. Hence, when conventional A/D converter 10 is used in applications where it is required to make discrete single-cycle conversions, most of the decimating filter circuitry serves no purpose.

DETAILED DESCRIPTION OF THE INVENTION

Improved oversampling A/D converter systems suitable for making single-cycle A/D conversions are provided. In a preferred embodiment of the present invention, only one multiply-accumulate processor is present in the digital filtering stage for decimating the output sequence R(I). A system controller may produce precisely timed modulator enable (EnM) and digital filter enable (EnF) signals for coordinating activation of certain circuit elements and for managing power consumption of the system.

Figure 5:
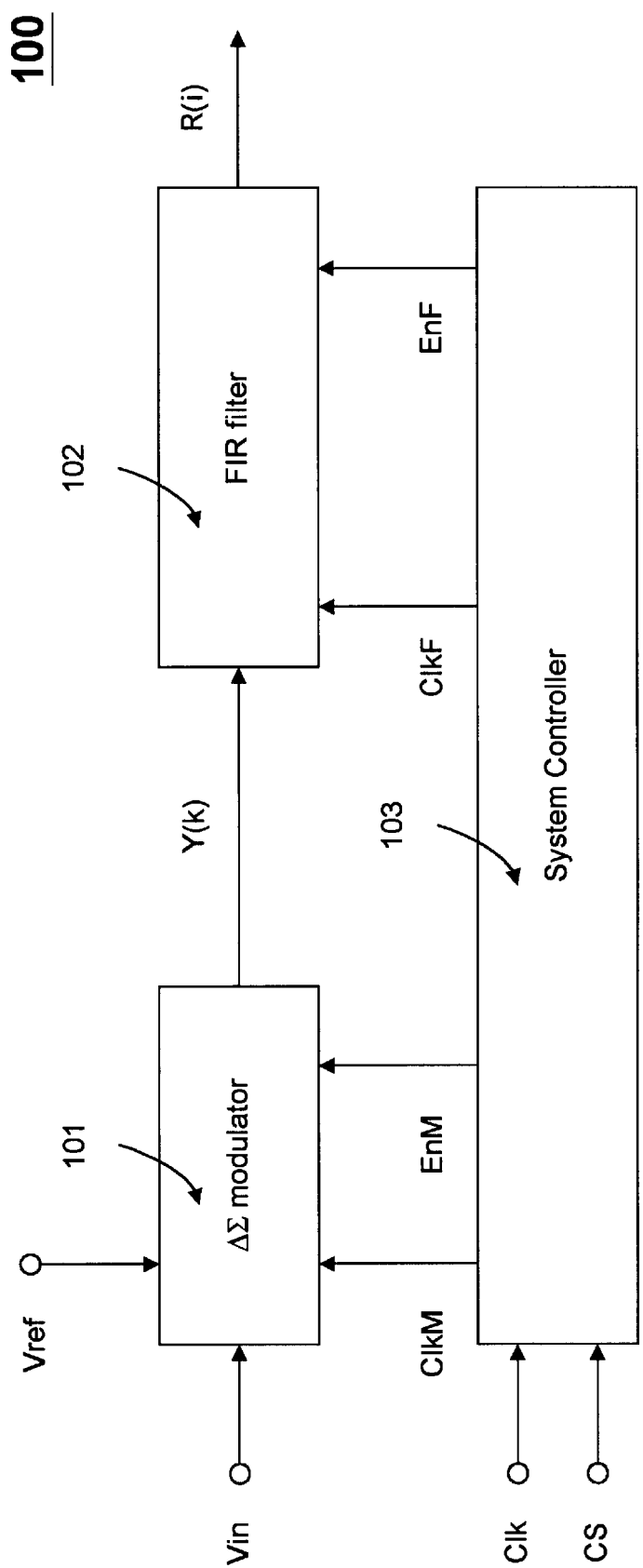
FIG. 5 is a block diagram of an oversampling A/D converter in constructed accordance with the principles present invention.

An oversampling A/D converter system 100 incorporating principles of the present invention is shown in FIG. 5. Oversampling A/D converter system 100 includes three basic blocks, delta-sigma modulator 101, finite-impulse-response (FIR) digital filter 102, and system controller 103. As shown in FIG. 5, modulator 101 and digital filter 102 each have circuit enable inputs. System controller 103 may selectively enable and disable these circuits by asserting and de-asserting their respective enable signals "EnM" and "EnF." Consequently, A/D converter system 100 may be enabled, disabled and then re-enabled to make a series of discrete analog-to-digital conversions at selected points in time.

It will be understood that the terms "asserted" and "de-asserted" are used herein only for convenience, and that no fixed logic levels are intended or should be inferred by the use of these terms. For example, these terms could interchanged without affecting the operation of the invention disclosed herein.

As shown in FIG. 5, operation of A/D converter 100 may be initiated by asserting a start conversion signal "CS" which directs system controller 103 to begin the conversion process. This signal may be generated in a number various ways depending upon the desired mode of operation. For example, the CS signal may be generated by an external source whenever an analog-to-digital conversion is desired (single-cycle operation). The CS signal may also be created internally (i.e., within A/D converter 100) in an automatic fashion immediately following the completion of a previous conversion (continuous operation), or it may be generated internally or externally at the expiration of an adjustable delay period following the completion of the previous conversion cycle (repetitive single-cycle operation). Controller 103 may also use an internally or externally generated clock signal Clk to produce a modulator clock signal ClkM, and a digital filter clock signal ClkF.

Modulator 101 may be initially set to a default low-power consumption mode (i.e., disabled) in order to conserve power. When the CS signal is asserted, system controller 103 may enable (i.e., activate) modulator 101 using the modulator enable signal (EnM). This allows modulator 101 to produce pulse-density modulated digital samples Y(k) that are a digital representation of the ratio between input signal Vin and reference signal Vref. Each time the CS signal is asserted, system controller 103 preferably enables modulator 101 for only the amount of time necessary to produce the minimum number of valid samples Y(k) required by digital filter 102 to generate one digital conversion result (i.e., one digital word). This number of samples is typically represented as n successive valid samples Y(k). The amount of time that modulator 101 may be enabled can be represented as the value of m+n where n is the required number of input samples and m is the transient delay of modulator 101 which may vary depending upon the specific configuration of modulator 101. After the m+n time period has expired, the last required analog input sample should have been processed by modulator 101. At this point, system controller 103 preferably de-asserts modulator enable signal (EnM) in order to disable modulator 101 once it has finished processing analog input signals. This allows modulator 101 to be disabled at the exact moment when in time the last analog input signal has been processed, thus conserving power.

It will be understood, however, that for some specific modulator architectures, there may be certain benefits associated with extending the time modulator 101 is enabled, such as simplification of the overall system timing requirements. In addition, extending the activation time may provide additional output samples Y(k), which may be useful for certain functions such as internal self-calibration.

As shown in FIG. 5, digital samples Y(k) are further processed by digital filter 102. Because digital samples Y(k) are delayed by a factor of m with respect to analog input signal Vin, valid samples of Y(k) are not present at the input of digital filter 102 when modulator 101 is initially enabled. Therefore, there is no need to enable digital filter 102 concurrently with modulator 101. System controller 103 preferably waits until the first valid sample of sequence Y(k) is present at the input of digital filter 102 before enabling it. This reduces the overall power consumption of A/D converter 100 during the conversion process by only enabling digital filter 102 when it is required to process digital samples Y(k).

System controller 103 may determine the proper time to enable digital filter 102 by counting-down the known transient delay time m from the moment modulator 101 is initially enabled. Once that period expires, the first valid sample of sequence Y(k) should be present at the input of digital filter 102. System controller 103 may then enable digital filter 102 by asserting the filter enable signal (EnF), thus allowing digital filter 102 to become enabled at the exact moment in time that the first valid digital sample Y(k) is present at its input.

When the filter enable signal (EnF) is asserted, digital filter 102 begins to filter digital samples Y(k). Digital samples Y(k) may be produced by modulator 101 at a frequency Fs and represent the pulse-modulated input signal (i.e., the ratio between Vin and Vref) together with any modulation noise and interference that may be included in the analog input signal Vin. As digital samples Y(k) propagate through digital filter 102, modulation noise is attenuated and samples Y(k) are decimated into digital output word R(I).

Similar to the operation of modulator 101, digital filter 102 is preferably enabled for only the minimum amount of time required to produce one digital conversion result. This amount of time can be represented as the value of n+p where n is the number of valid input samples Y(k) processed by digital filter 102 and p is the pipeline delay of digital filter 102 which may vary depending upon the filter's specific configuration. After the n+p time period has expired, system controller 103 preferably de-asserts the filter enable signal (EnF) thus disabling filter 102 when it is finished processing input samples Y(k). This reduces the power consumption of A/D converter 100 by disabling digital filter 102 when conversions are not being performed.

System controller 103 may determine the proper time to disable digital filter 102 by counting-down the known pipeline delay time p from the moment that modulator 101 is disabled. Once that period expires, the last valid sample of Y(k) should have been processed by digital filter 102. This allows digital filter 102 to be disabled at the exact moment when in time the last valid digital sample Y(k) has been filtered.

It will be understood, however, that for some specific digital filter architectures there may be certain benefits associated with extending the time digital filter 102 is enabled such as simplification of the overall system timing requirements. In addition, extending the activation time of filter 102 may provide additional output words R(I) which can be used for certain functions such as internal self-calibration.

Although only a generalized block diagram of digital filter 102 suitable for use in the present invention is shown in FIG. 5, a specific implementation of such a filter is described in a co-pending commonly-assigned patent application "Hardware Implementation of a Decimating Finite Impulse Response Filter," application Ser. No. 09/135,229, which is hereby incorporated by reference.

The A/D converter system 100 shown in FIG. 5 may operate as follows. Initially, A/D converter 100 may be in a default "power-conservation" mode with the conversion start signal CS de-asserted. In this mode, system controller 103 may place both modulator 101 and digital filter 102 in a low power consumption state (i.e., disabled) by de-asserting both the filter enable signal (EnF) and the modulator enable signal (EnM). When the CS signal is asserted, system controller 103 may enable modulator 101 to produce a pulse-density modulated sequence Y(k) of analog input signal Vin. Modulator 101 may be enabled for a time value greater than or equal to m+n to obtain n valid samples Y(k) and then may be immediately disabled by controller 103. Digital filter 102 preferably remains disabled until the first valid sample Y(k) is present at its input. System controller 103 may then enable digital filter 103 for a time value greater than or equal to n+p in order to attenuate modulation noise and to decimate digital samples Y(k) into a digital output word R(I). System controller 103 may then immediately disable digital filter 102. At this point, A/D converter 100 has returned to the default power-conservation mode and may remain there until the conversion start signal CS is once again asserted.

By operating in this way, A/D converter system 100 reduces its overall power consumption in both the conversion mode (i.e., when the CS signal asserted and an A/D conversion is in progress) and in the idle mode (i.e., when the CS signal is de-asserted and no A/D conversion in progress). For example, in the conversion mode, modulator 101 and digital filter 102 may be enabled by system controller 103 only for the minimum amount of time required to perform their respective tasks, otherwise they are disabled. This allows A/D converter 100 to consume only the minimum amount of power necessary to produce a conversion result. Similarly, in the idle mode, system controller 103 may disable modulator 101 and digital filter 102 to minimize power consumption during periods for which A/D converter system 100 is inactive.

In FIG. 5, if the conversion start signal CS is asserted synchronously with the application of a new input signal Vin (e.g., if the conversion start signal CS is asserted when the state of an input multiplexer is changed) the transient response time of A/D converter 100 may be defined as the value of m+n+p clock cycles. This is the minimum possible transient delay for A/D converter 100 wherein digital filter 102 has a coefficient sequence of length n. If the conversion start signal CS is asserted a synchronously with the application of a new input signal Vin (e.g., if the state of an input multiplexer changes some time after the conversion start signal CS is asserted but before A/D converter completes a conversion cycle) the transient response time of A/D converter 100 may be defined as the value of 2*n+m+p−1 clock cycles. This is because the conversion start signal CS may be maintained asserted at the end of a conversion cycle during which the input signal was changed so that A/D converter 100 can perform a subsequent conversion to produce a result which accurately reflects the new input signal. The 2*n+m+p−1 value represents the maximum transient delay for A/D converter 100 wherein digital filter 102 has a coefficient sequence of length n. Thus, the A/D converter 100 provides well-defined settling times to facilitate input multiplexing.

Figure 6:
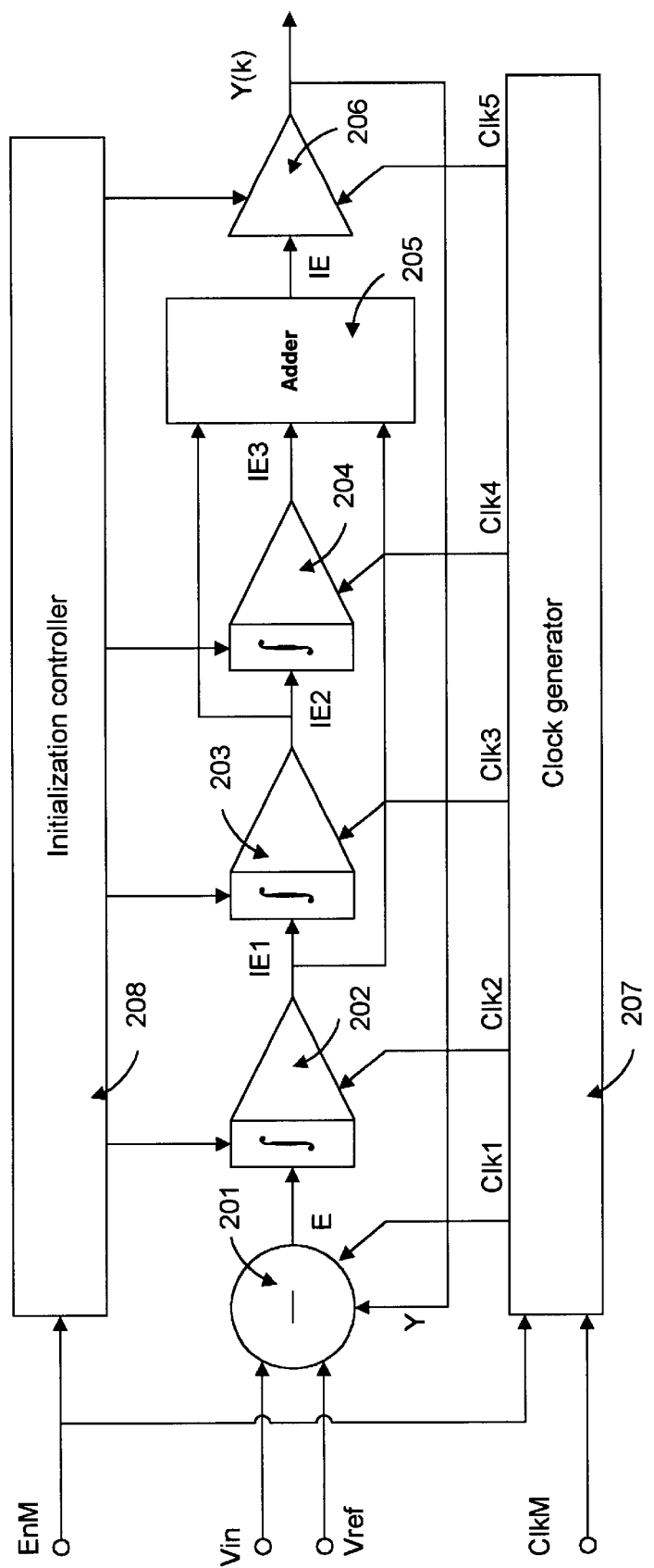
FIG. 6 is a schematic diagram of portions of a third-order delta-sigma modulator constructed in accordance with the principles of the present invention.

Specific implementations of delta-sigma modulators are well known in the art and have often been described in such papers as "Principles of Oversampling A/D Conversion," by Max Hauser in *J. Audio Eng. Soc.*, Vol. 39 No. ½, 1991. A schematic diagram of a suitable delta-sigma modulator for use in the present invention is shown in FIG. 6. In FIG. 6, a third order delta-sigma modulator 200 is shown which has all three poles in the origin and feed-forward stabilization. Modulator 200 includes summing node 201, integrators 202–204, adder 205, comparator 206, clock generator 207 and initialization controller 208. In operation, modulator 200 pulse-density modulates analog input signal Vin to produce digital samples Y(k). When modulation is desired (e.g., when the conversion start signal CS is asserted and the state of an input multiplexer is changed), the modulator enable signal (EnM) is asserted and an analog input signal Vin is provided at the input of summing node 201. In response to the assertion of the modulator enable signal (EnM), clock generator 207 may use the modulator clock signal (ClkM) to produce clock signals Clk1, Clk2, Clk3, Clk4 and Clk5 with the appropriate relative phase relationships so that the operation of certain portions of modulator 200 (i.e., summing node 201, integrators 202–204, output adder 205 and comparator 206) are properly coordinated.

For every cycle of clock signal Clk1, analog reference signal Vref is subtracted from the input signal Vin as directed by digital feedback signal Y at summing node 201. This produces a resultant error signal E which is applied to the input of integrator 202. Integrator 202 integrates the resultant error signal E during each cycle of clock signal Clk2 and generates an output signal IE1 which is applied to the input of both integrator 203 and adder 205. Integrator 203 further integrates IE1 during each cycle of clock signal Clk3 and generates an output signal IE2 which is applied to the input of both integrator 203 and adder 205. Integrator 204 further integrates IE2 during each cycle of clock signal Clk4 and generates an output signal IE3 which is applied to the input of adder 205. Adder 205 generates the algebraic sum of the three output signals IE1, IE2 and IE3 with specific weights and signs to create a third-order integrated and feed-forward compensated error signal IE which is applied to the input of comparator 206. At this point, comparator 206 may compare error signal IE with an internal reference voltage (not shown) and produce a digital output sample Y(k) for every cycle of clock signal Clk5. Comparator 206 may be configured to produce either single-bit or multi-bit output words depending on the desired resolution of output sample Y(k).

Once a desired number of digital output samples Y(k) have been produced, modulator 200 may be disabled by de-asserting the modulator enable signal (EnM). When modulator 200 is disabled, it is typically desirable to "initialize" or "reset" integrators 202–204 and comparator 206 to a predefined set of initial conditions using initialization controller 208 to ensure the stability of modulator 200. Such initializations may be accomplished by turning ON or OFF certain switches (not shown) connected across the integrating capacitors (not shown) of each one of the three integrators 202–204 and by resetting comparator 206 to Y=0 state.

Although the initial conditions of integrators 202–204 and comparator 206 have only a small effect upon the accuracy of the conversion result produced by A/D converter system 100 (FIG. 5), it is usually difficult to guarantee the stability of the modulator due to the unpredictability of initial conditions. The usual practical approach to test for stability is an extensive simulation of all the possible initial condition cases. For the general case this represents a cross product of all possible input signal values and all possible modulator initial conditions. By precisely defining the initial conditions of modulator 200 (i.e., integrators 202–204 and comparator 206), the number of possible cases that must be simulated to guarantee the overall modulator stability is dramatically reduced, thus minimizing the amount of time necessary to design modulator 200.

The A/D converter system 100 shown in FIG. 5 may allow modulator 101 to be initialized just before the beginning of a new conversion cycle using the modulator enable signal (EnM). For example, the modulator enable signal (EnM) 101 is typically deasserted by system controller 103 to disable modulator 101 after it produces n valid samples Y(k). During a portion of the time modulator 101 is disabled, digital filter 102 may still be processing digital samples Y(k) to complete the conversion cycle. De-asserting the modulator enable signal (EnM) may cause some or all of the integrating capacitors (not shown) within modulator 101 to be initialized so that when the next conversion cycle begins (i.e., when the modulator enable signal (EnM) is once again asserted) modulator 101 is already initialized.

As an additional power saving measure, when the modulator 101 is disabled, some or all of the circuits contained in modulator 101 may be turned off. The non-negligible stabilization time required by modulator 101 when those circuits are turned back on (i.e., when the enable modulator signal (EnM) is once again asserted) can be accounted for by the modulator transient delay factor m. This approach provides a very precise power management mechanism resulting in minimal power consumption.

Figure 7:
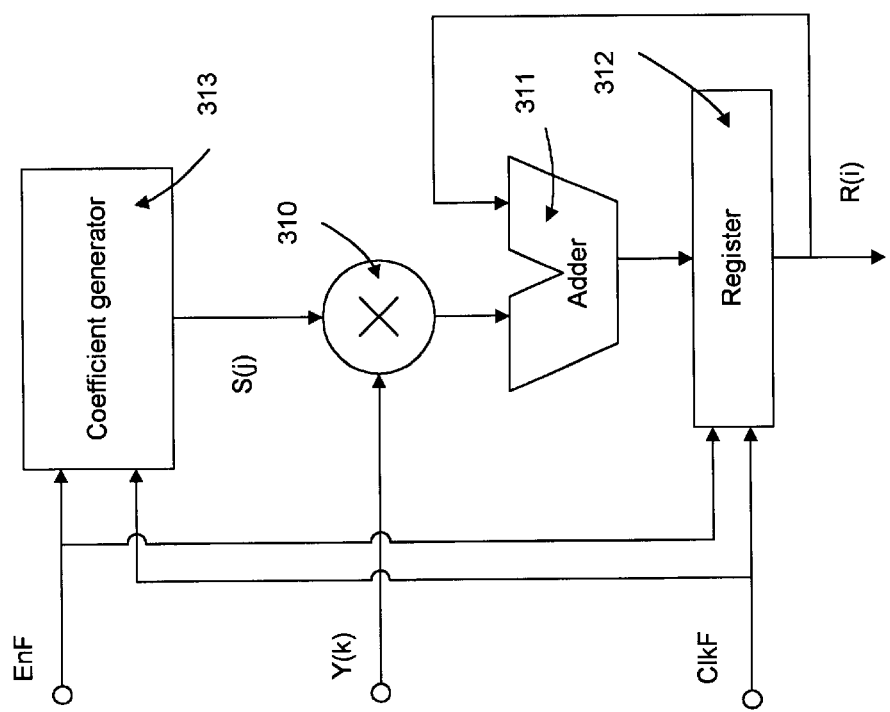
FIG. 7 is a schematic diagram of a single multiply-accumulate processor arrangement that may be used in the decimating digital filter of the present invention.

Specific implementations of FIR decimation filters are well known in the art and have often been described in such papers as "A Novel Architecture Design For VLSI Implementation Of An FIR Decimation Filter," *IEEE Proc ICASP* '85, pp. 1380–1383, March 1985. A schematic diagram of a multiply-accumulate processor suitable for use in the digital decimating filter of the present invention is shown in FIG. 7.

Unlike prior art A/D converter systems which employ multiple multiply-accumulate processors in their digital filters, the A/D converter system of the present invention preferably includes only one multiply-accumulate processor in its digital filtering stage. This can be seen by comparing the prior art multiply-accumulate processor scheme of FIG. 3 or FIG. 4 with the single multiply-accumulate processor shown in FIG. 7.

As discussed in the background section of this application, traditional oversampling A/D converter systems are configured to produce multiple conversion results from a given input signal. Analog input signals are applied to the input of these A/D converters for a long enough time so that their multiply-accumulate processors overcome the transient delay period by accumulating enough convolution results to begin producing digital output signals at a data rate much faster than normally possible with only one multiply-accumulate processor. Such A/D converters rely on the assumptions that: 1) it is desired to obtain multiple sequential conversion results from a particular input signal and 2) that they will be connected to one input signal long enough to accumulate the input samples required to begin producing digital conversion results at the faster data rate.

However, these assumptions are not always true. In fact, in many data acquisition applications such as test and measurement and industrial control it is often desired to obtain a series of single cycle conversion results from a number of unrelated sources. For example, the input of an A/D converter installed in a computer may be connected to a multiplexer that scans the operating voltages of several actuators on a production line. The computer may monitor the actuator operating voltages with the A/D converter to ensure they are operating within a specified voltage range. In this and similar applications the multiplexer remains connected to a particular input channel only long enough for the A/D converter to produce one conversion result. After that conversion result is obtained, the A/D converter may be reset as the multiplexer changes channels so that the next input signal can be converted.

For single cycle conversion applications such as the one described above, A/D converters need only one multiply-accumulate processor in their digital filtering stage. This is because only one complete convolution result needs to be generated for each input signal. After that result is produced, a new input signal is applied to the A/D converter which requires the convolution process to start from the beginning. Any convolution results stored in other multiply-accumulate processors from the previous conversion cycle must be discarded as inaccurate or are lost when the A/D converter is reset. Therefore, when conventional A/D converters containing multiple multiply-accumulate processors are used in single-cycle applications, all but one of those multiply accumulate processors serves no purpose.

In contrast to the conventional A/D converters, the present invention provides A/D converters with digital filters that use a single multiply-accumulate processor arrangement suitable for making efficient single-cycle A/D conversions. This type of arrangement greatly simplifies the digital filter implementation and reduces power consumption. An example of a suitable multiply-accumulate processor arrangement for use in digital filter 102 of the present invention (FIG. 5) is shown in FIG. 7.

In FIG. 7, multiply-accumulate processor 300 includes input multiplier 310, adder 311, register 312, and coefficient generator 313. In operation, multiply accumulate processor 300 attenuates modulation noise and decimates the digital samples Y(k) that are supplied by modulator 101 (FIG. 1) to produce digital output word R(I). When filtering is desired, the filter enable signal (EnF) is asserted which directs coefficient generator 313 to provide the first coefficient S(1) of coefficient sequence S(j) at one input of multiplier 310 at the exact moment in time at which the first valid modulator output sample Y(1) is available at the other input of the multiplier 310. The filter enable signal (EnF) is maintained asserted a sufficiently long period of time for all the n filter coefficients S(j), j=1,2 . . . n generated by the coefficient generator 313 to be multiplied with the corresponding modulator output sample Y(k), k=1,2 . . . n. And the results of that multiplication are accumulated in the register 312 by the adder 311 to produce a complete convolution result (which is the digital output word R(I)).

Once a digital output word R(I) has been output by register 312, multiply accumulate processor 300 may be disabled by de-asserting the filter enable signal (EnF). When disabled, some or all of the circuits in digital filter 102 (FIG. 5) may be placed in a power conservation mode to minimize power consumption. As an additional power saving mechanism, system controller 103 (FIG. 5) may interrupt the operation of clock signal ClkF while the filter enable signal (EnF) signal is de-asserted. Furthermore, when the filter enable signal (EnF) transitions from the de-asserted state to the asserted state, register 312 (FIG. 7) may be initialized to delete any previous convolution results which may be present from previous conversions.

Although preferred embodiments of the present invention have been disclosed with various circuits connected to other circuits, persons skilled in the art will appreciate that it may not be necessary for such connections to be direct and additional circuits may be interconnected between the shown connected circuits without departing from the spirit of the invention as shown. Persons skilled in the art also will appreciate that the present invention can be practiced by other than the described embodiments. The described embodiments are presented for purposes of illustration and not of limitation, and the present invention is limited only by the claims which follow.

What is claimed is:

1. An oversampling analog-to-digital converter circuit comprising:
    a delta-sigma modulator circuit that receives an analog input signal and converts said analog input signal to modulated digital samples, said delta-sigma modulator circuit having an input and an output;
    a filter circuit coupled to said output of said modulator circuit that receives said modulated digital samples from said modulator circuit and converts said modulated digital samples into a digital output word; and
    a system controller circuit coupled to said modulator circuit and said filter circuit that selectively enables and disables said modulator circuit and said filter circuit.

2. The oversampling analog-to-digital converter circuit defined in claim 1 wherein said system controller circuit is configured to receive a conversion start signal such that when said conversion start signal is asserted said system controller circuit directs said analog-to-digital converter circuit to convert said analog input signal into said digital output word.

3. The oversampling analog-to-digital converter circuit defined in claim 2 wherein said system controller circuit is configured to disable said analog-to-digital converter circuit when said digital output word is produced.

4. The oversampling analog-to-digital converter circuit defined in claim 1 wherein said modulator circuit is configured to receive a modulator enable signal from said system controller circuit.

5. The oversampling analog-to-digital converter circuit defined in claim 4 wherein said modulator circuit is enabled when said modulator enable signal is asserted.

6. The oversampling analog-to-digital converter circuit defined in claim 4 wherein said modulator circuit is disabled when said modulator enable signal is de-asserted.

7. The oversampling analog-to-digital converter circuit defined in claim 6 wherein:
    said modulator is enabled when said modulator enable signal is asserted; and
    said system controller circuit maintains the modulator enable signal asserted for a period of time necessary for said modulator circuit to produce an amount of digital samples required by said digital filter circuit to generate said digital output word.

8. The oversampling analog-to-digital converter circuit defined in claim 1 wherein said filter circuit is configured to receive a filter enable signal from said system controller circuit.

9. The oversampling analog-to-digital converter circuit defined in claim 8 wherein said filter circuit is enabled when said filter enable signal is asserted.

10. The oversampling analog-to-digital converter circuit defined in claim 8 wherein said filter circuit is disabled when said filter enable signal is de-asserted.

11. The oversampling analog-to-digital converter circuit defined in claim 10 wherein:
    said digital filter circuit is enabled when said filter enable signal is asserted; and
    said system controller circuit maintains said filter enable signal asserted for a period of time necessary for said filter circuit to filter said digital output samples produced by said modulator circuit to generate said digital output word.

12. The oversampling analog-to-digital converter circuit defined in claim 1 wherein the modulator circuit is a third order delta-sigma modulator.

13. The oversampling analog-to-digital converter circuit defined in claim 1 wherein the modulator circuit further comprises clock generator circuitry.

14. The oversampling analog-to-digital converter circuit defined in claim 1 wherein the modulator circuit further comprises an initialization controller.

15. The oversampling analog-to-digital converter circuit defined in claim 14 wherein the modulator circuit further comprises integrating circuitry and wherein said initialization controller is capable of selectively resetting the integrator circuitry to predefined set of initial conditions.

16. The oversampling analog-to-digital converter circuit defined in claim 14 wherein the modulator further comprises comparator circuitry and wherein said initialization controller is capable of selectively resetting the comparator circuitry to predefined set of initial conditions.

17. The oversampling analog-to-digital converter circuit defined in claim 1 wherein said filter circuitry is a finite impulse response filter.

18. The oversampling analog-to-digital converter circuit defined in claim 1 wherein said digital filter circuitry further comprises a coefficient generator.

19. The oversampling analog-to-digital converter circuit defined in claim 18 wherein said coefficient generator is configured to receive a filter enable signal from said system controller circuit.

20. The oversampling analog-to-digital converter circuit defined in claim 1 having a settling time of m+n+p when said analog input signal is applied synchronously to said analog-to-digital converter circuit.

21. The oversampling analog-to-digital converter circuit defined in claim 1 having a settling time of 2*n+m+p−1 when said analog input signal is applied a synchronously to said analog-to-digital converter circuit.

22. The oversampling analog-to-digital converter circuit defined in claim 1 wherein said digital filter circuit further comprises one multiply-accumulate processor.

23. A method for converting analog signals to digital signals comprising:
    modulating said analog signals to create modulated digital samples;
    filtering said modulated digital samples with a digital filter to create a digital output word; and
    providing control signals that selectively enable and disable the operation of circuitry that modulates and filters.

24. The method defined in claim 23 wherein the providing step further comprises:

enabling the modulator for the period of time necessary to produce an amount of digital samples required by said digital filter to generate the digital output word.

25. The method defined in claim 24 wherein the providing step further comprises:

disabling the modulator immediately after said amount of digital samples is produced.

26. The method defined in claim 24 wherein the providing step of further comprises:

enabling said digital filter when a first of said digital samples is provided.

27. The method defined in claim 24 wherein the providing step of further comprises:

disabling said digital filter immediately after said digital output word is produced.

28. The method defined in claim 23 wherein modulating is characterized by use of a delta-sigma modulator.

29. The method defined in claim 23 wherein filtering is characterized by use of a finite impulse response filter.

30. The method defined in claim 23 wherein said analog-to-digital conversion is characterized by a settling time of m+n+p when said analog signals are converted to said digital output word synchronously.

31. The method defined in claim 23 wherein said analog-to-digital conversion is characterized by a settling time of 2*n+m+p−1 when said analog signals are converted to said digital output word a synchronously.

32. A method for making single-cycle analog-to-digital conversions comprising:

directing modulator circuitry to modulate analog input signals to produce modulated digital samples;

providing control signals that selectively enable and disable the modulator circuitry and that selectively initializes said modulator circuitry.

33. The method defined in claim 32 further comprising:

directing digital filter circuitry to filter said modulated digital samples to produce a digital output word.

34. The method defined in claim 33 further comprising:

providing control signals that selectively enable and disable the directing of said filter circuitry and that selectively initializes said filter circuitry.

35. The method defined in claim 32 wherein the providing step further comprises:

enabling the modulator directing of said modulator circuitry for a period of time necessary to produce said amount of digital samples required by the digital filter to generate said digital output word.

36. The method defined in claim 35 wherein the providing step further comprises:

disabling said modulator directing step immediately after said amount of digital samples is produced.

37. The method defined in claim 35 wherein the providing step further comprises:

initializing said modulator circuitry after said amount of digital samples is produced.

38. The method defined in claim 37 wherein the initializing step further comprises:

setting integrator circuitry to a set of predefined initial conditions.

39. The method defined in claim 35 wherein the providing step of further comprises:

enabling the directing of said digital filter circuitry when a first of said modulated digital samples is provided.

40. The method defined in claim 39 wherein the providing step of further comprises:

disabling the directing of said filter immediately after said digital output word is produced.

41. The method defined in claim 39 wherein the providing step further comprises:

initializing said digital filter circuitry after said digital output word is produced.

42. The method defined in claim 41 wherein the initializing step further comprises:

setting said digital filter circuitry to a set of predefined initial conditions.

43. The method defined in claim 32 wherein the modulator directing step is characterized by use of a delta-sigma modulator.

44. The method defined in claim 32 wherein the filter directing step is characterized by use of a finite impulse response filter.

* * * * *

UNITED STATES PATENT AND TRADEMARK OFFICE
CERTIFICATE OF CORRECTION

PATENT NO. : 6,208,279 B1  Page 1 of 1
DATED : March 27, 2001
INVENTOR(S) : Oprescu It is certified that error appears in the above-identified patent and that said Letters Patent is hereby corrected as shown below:

<u>Title page,</u>
Item [73], Assignee, please change "Linear Technology Dorporation, CA (US)" to
-- Linear Technology Corporation, Milpitas, Calif. --

Signed and Sealed this

Eighth Day of June, 2004

JON W. DUDAS
*Acting Director of the United States Patent and Trademark Office*